United States Patent
Park et al.

(10) Patent No.: US 6,878,596 B2
(45) Date of Patent: Apr. 12, 2005

(54) METHOD OF FORMING HIGH VOLTAGE JUNCTION IN SEMICONDUCTOR DEVICE

(75) Inventors: Jeong Hwan Park, Ichon-Shi (KR); Noh Yeal Kwak, Ichon-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/310,884

(22) Filed: Dec. 6, 2002

(65) Prior Publication Data
US 2004/0014294 A1 Jan. 22, 2004

(30) Foreign Application Priority Data
Jul. 18, 2002 (KR) ................................ 10-2002-0042157

(51) Int. Cl.$^7$ .............................................. H01L 21/336
(52) U.S. Cl. ........................................................ 438/301
(58) Field of Search ................................ 438/268, 273, 438/276, 279, 303, 305, 306, 527–533, FOR 182, 197, 200, 201, 217, 223, 231–233, 289, 290, 301, 585, 586, 597, 291, 230, 542, 546, FOR 176, FOR 188, FOR 192; 257/334, 336–337, E29.012, E29.278, E21.435, E21.417, E29.256

(56) References Cited

U.S. PATENT DOCUMENTS

| | | | | |
|---|---|---|---|---|
| 4,590,665 A | * | 5/1986 | Owens et al. ............ | 438/257 |
| 5,395,784 A | * | 3/1995 | Lu et al. .................. | 438/241 |
| 5,404,040 A | * | 4/1995 | Hshieh et al. ........... | 257/341 |
| 5,565,369 A | * | 10/1996 | Ko .......................... | 438/305 |
| 5,899,718 A | * | 5/1999 | Chen et al. ............. | 438/264 |
| 5,920,774 A | | 7/1999 | Wu .......................... | 438/224 |
| 6,187,619 B1 | | 2/2001 | Wu .......................... | 438/224 |
| 6,277,695 B1 | * | 8/2001 | Williams et al. ........ | 438/268 |
| 6,319,798 B1 | * | 11/2001 | Yu ........................... | 438/527 |
| 6,548,363 B1 | * | 4/2003 | Wu et al. ................ | 438/305 |
| 2002/0125540 A1 | * | 9/2002 | Shimotsusa et al. ..... | 257/467 |

* cited by examiner

Primary Examiner—George Fourson
Assistant Examiner—Brook Kebede
(74) Attorney, Agent, or Firm—Mayer, Brown, Rowe & Maw LLP

(57) ABSTRACT

The present invention relates to a method of forming a high voltage junction in a semiconductor device. The method includes forming a double diffused drain junction, and making amorphous the double diffused drain junction to a first depth by implanting an impurity having a high atomic weight than an impurity injected into the double diffused drain junction, implanting an impurity so that the concentration of the concentration of an impurity to a second depth lower than the first depth and then activating the impurities. Thus, the present invention can reduce the sheet resistance by prohibiting diffusion of an impurity, prohibit a channeling phenomenon by lowering the depth of the junction, and remove crystal defects by sufficiently activating an impurity and since a subsequent annealing process for activation can be performed at a high temperature, and thus improve reliability of a process and an electrical characteristic of the device.

11 Claims, 3 Drawing Sheets

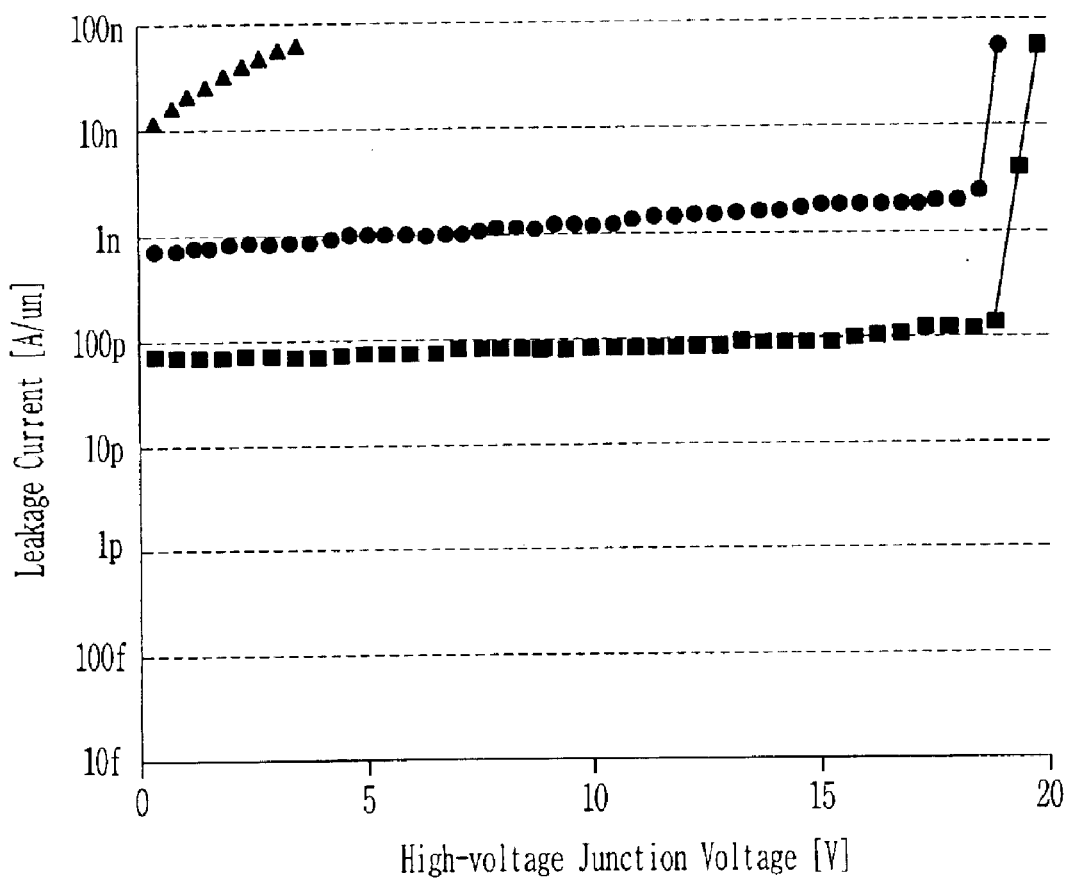

METHOD OF FORMING HIGH VOLTAGE JUNCTION IN SEMICONDUCTOR DEVICE

BACKGROUND OF THE INVENTION

1. Field of the Invention

The invention relates generally to a method of forming a high voltage junction in a semiconductor device. More particularly, the invention relates to a method of forming a high voltage junction in a semiconductor device capable of minimizing crystal defects in a process of forming a junction structure to which a high voltage is applied and forming a junction structure of a shallow depth having a low breakdown voltage and a low sheet resistance.

2. Description of the Prior Art

A semiconductor device may be classified into a high voltage device and a low voltage device depending on its driving voltages. Of them, the high voltage device includes a high voltage transistor used in a charge pump circuit for generating a program voltage or an erase voltage of a high voltage in the flash memory device. A junction structure of the high voltage device such as the high voltage transistor (for example, source and drain of the high voltage transistor, hereinafter called 'high voltage junction structure') is applied with a voltage (for example, 15V) that is higher than the voltage applied to a common transistor.

This high voltage junction structure is formed by forming a high voltage DDD junction (HVN double diffused drain junction) and then performing an ion implantation process using a N+ source/drain mask. The N+ junction structure formed thus neighbors the high voltage DDD junction. Therefore, from a viewpoint that the effective length (Leff) is not reduced even though a high voltage junction breakdown of over 20V is usually required in the NAND device, it is impossible to unlimitedly increase the DDD junction.

Meanwhile, in order to maintain a satisfactory drain current, it is required that an impurity of a high concentration be implanted into a relatively narrow region. In order to form this high voltage junction, if only As is implanted as a single dopant by means of an ion implantation process, crystal defects are caused due to excess As ions. Thus, the leakage current of the junction structure is increased. In order to remove the crystal defects due to implantation of As ions, it is required that an annealing process of over 950° C. be performed. However, if the high-temperature annealing process is performed, the high voltage junction structure having a shallow depth could not be formed due to diffusion of the impurity. Further, as the activation rate of As is about 30% in the high-temperature annealing process of 950° C., there is a problem that the resistance of the high-temperature junction structure is abnormally increased.

During the high-temperature ion implantation process, if P is implanted as a single dopant instead of As, it is advantageous in lowering the sheet resistance of the high voltage junction structure and minimize generation of the defects. However, there are problems that the depth of the high voltage junction structure is increased and a shot channel effect phenomenon is generated at devices of higher-integration, due to a large diffusivity characteristic and a severe channeling phenomenon of P in the high-temperature annealing process.

SUMMARY OF THE INVENTION

The present invention is contrived to solve the above problems and an object of the present invention is to provide a method of forming a high voltage junction in a semiconductor device that can reduce the sheet resistance by prohibiting diffusion of an impurity, prohibit a channeling phenomenon by lowering the depth of the junction, and remove crystal defects by sufficiently activating an impurity since a subsequent annealing process for activation can be performed at a high temperature, and thus improve reliability of a process and an electrical characteristic of the device, in such a way that a double diffused drain junction is formed, the double diffused drain junction is made amorphous up to a first depth by implanting an impurity having a higher atomic weight than the impurity injected into the double diffused drain junction, implanting an impurity so that the concentration of the impurity becomes at a second depth lower than the first depth, and then activating the impurities.

In order to accomplish the above object, the method of forming the high voltage junction in the semiconductor device according to the present invention, is characterized in that it comprises the steps of forming a double diffused drain junction in a junction region of a semiconductor substrate on which a gate oxide film and a gate electrode are stacked, exposing only the double diffused drain junction at a region where a contact plug will be formed, implanting an impurity and simultaneously making amorphous the double diffused drain junction up to a first depth, by means of a first ion implantation process, implanting an impurity up to a second depth lower than the first depth by means of a second ion implantation process so that the concentration of the impurity becomes a target value, and activating the impurities implanted into the double diffused drain junction by means of an annealing process.

In the above, the gate oxide film is formed in thickness of 200 through 400 Å by means of a wet oxidization method.

The double diffused drain junction is formed by implanting P of 1E13 through 1E14 atoms/cm$^2$ at the ion implantation energy of 50 KeV through 120 KeV. At this time, P is implanted at an angle of 0 through 22°.

The first ion implantation process includes implanting an impurity having a higher atomic weight than the impurity implanted into the double diffused drain junction, or includes implanting As of 1E15 through 2E15 atoms/cm$^2$ at the ion implantation energy of 10 KeV through 40 KeV. At this time, the first depth is same to or lower than the depth of the double diffused drain junction.

The second ion implantation process includes implanting P. The second ion implantation process includes implanting P of 1E13 through 1E14 atoms/cm$^2$ at the ion implantation energy of 0.5 KeV through 30 KeV. At this time, P is implanted at an angle of 0 through 22°.

The annealing process is performed in the furnace at a temperature of 800 through 950° C. or at a temperature of 850 through 950° C. as rapid annealing.

BRIEF DESCRIPTION OF THE DRAWINGS

The aforementioned aspects and other features of the present invention will be explained in the following description, taken in conjunction with the accompanying drawings, wherein:

FIG. 2 is a graph showing a leakage current characteristic depending on a voltage in the high voltage junction of the present invention.

DETAILED DESCRIPTION OF PREFERRED EMBODIMENTS

Figure 1A:
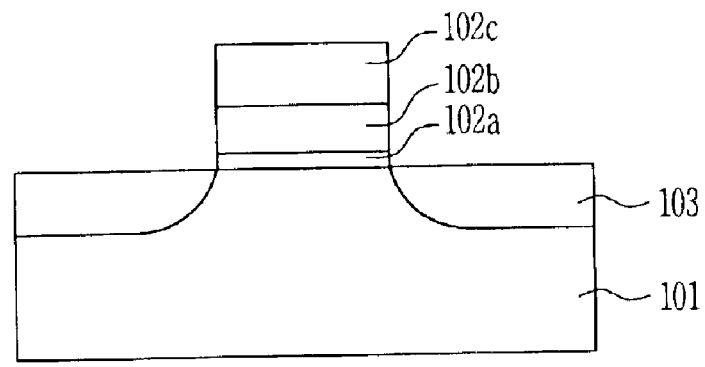
FIG. 1A through FIG. 1E are cross-sectional views of semiconductor devices for explaining a method of forming a high voltage junction in the semiconductor device according to a preferred embodiment of the present invention.

The present invention will be described in detail by way of a preferred embodiment with reference to accompanying drawings, in which like reference numerals are used to identify the same or similar parts.

FIG. 1A through FIG. 1E are cross-sectional views of semiconductor devices for explaining a method of forming a high voltage junction in the semiconductor device according to a preferred embodiment of the present invention.

Referring now to FIG. 1A, a stack structure of a gate oxide film 102a, a gate 102b and a hard mask 102c is formed on a semiconductor substrate 101. After the stack structure is then patterned, double diffused drain (DDD) junctions 103 are formed in the semiconductor substrate 101 at both sides of the gate 102b by means of an ion implantation process.

In the above, the gate oxide film 102a is formed by a wet oxidization method. In order to increase the breakdown voltage of the junction to a high voltage (for example, 40V), the junction is formed in thickness of 200 through 400 Å. Next, the double diffused drain junction 103 is formed by implanting phosphorus (P) of 1E13 through 1E14 atoms/$cm^2$ at the ion implantation energy of 50 KeV through 120 KeV. At this time, P is implanted at an angle of 0 through 22°.

Figure 1B:
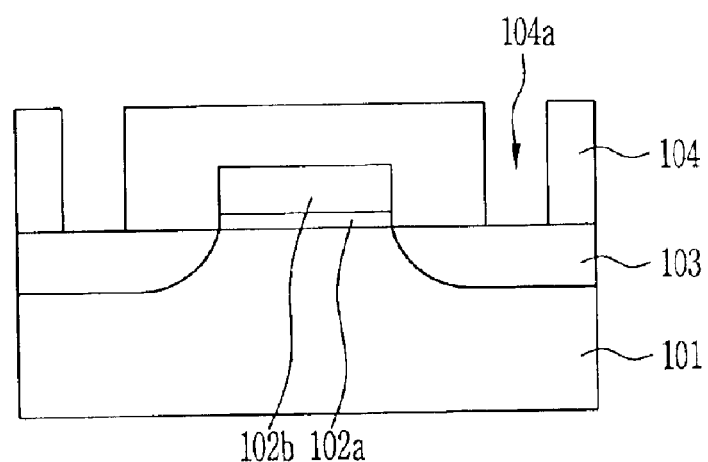

Referring now to FIG. 1B, an ion implantation mask layer 104 is formed on the entire structure. Apertures 104a are formed in the ion implantation mask layer 104 by means of exposure/etch processes, so that the double diffused drain junction 103 at a region where a contact plug will be formed is opened. At this time, the ion implantation mask layer 104 may be formed using a photoresist or an insulating film.

Figure 1C:
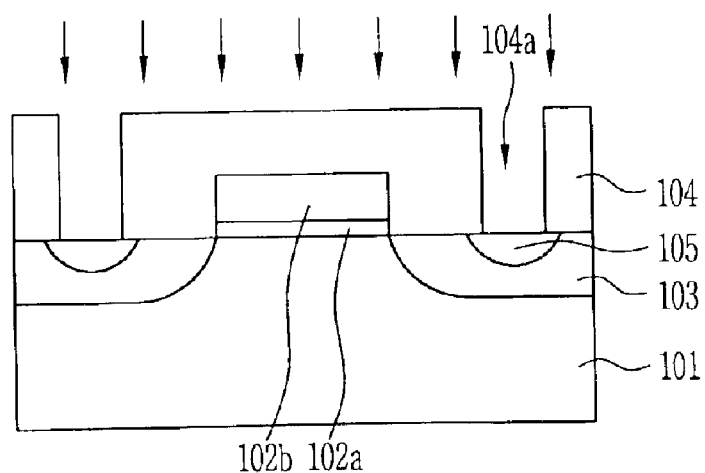

By reference to FIG. 1C, an impurity is implanted into the double diffused drain junction 103 through the apertures 104a by means of the ion implantation process and the double diffused drain junction 103 is simultaneously made amorphous up to a given depth. At this time, in order to improve an amorphous characteristic, the impurity implanted into the double diffused drain junction 103 that is higher in the atomic weight than the impurity implanted into the double diffused drain junction 103 may be used. If P is implanted into the double diffused drain junction 103, arsenic (As) may be used as an impurity for amorphousness. Thereby, the amorphous layer 105 into which As is implanted is formed in the double diffused drain junction 103. At this time, the amorphous layer 105 is formed so that the depth of the amorphous layer 105 is same to or shallower than that of the double diffused drain junction 103.

In concrete, for example, the amorphous layer 105 of a given depth is formed in the double diffused drain junction 103 by implanting As of 1E15 through 2E15 atoms/$cm^2$ at the ion implantation energy of 10 KeV through 40 KeV.

Figure 1D:
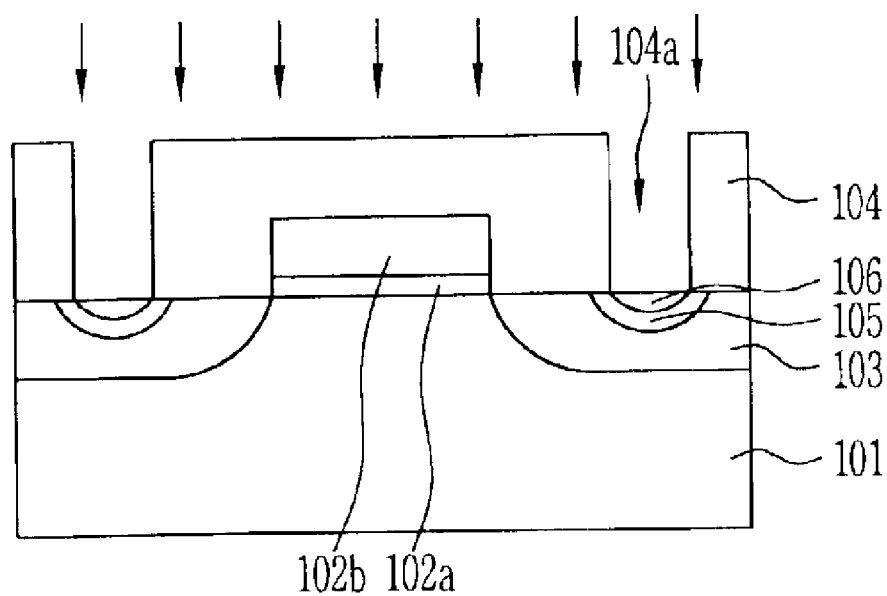

Referring to FIG. 1D, an ion implantation layer 106 is formed in the double diffused drain junction 103 by means of the ion implantation process through the apertures 104a, so that the concentration of the impurity in the junction becomes a given concentration. At this time, the ion implantation layer 106 is formed by implanting the impurity up to a depth shallower than the amorphous layer 105. Also, P may be implanted as the impurity or P may be implanted at an angle of 0 through 22°.

In detail, for example, the ion implantation layer 106 is formed by implanting P of 1E13 through 1E14 atoms/$cm^2$ at the ion implantation energy of 0.5 KeV through 30 KeV.

Figure 1E:
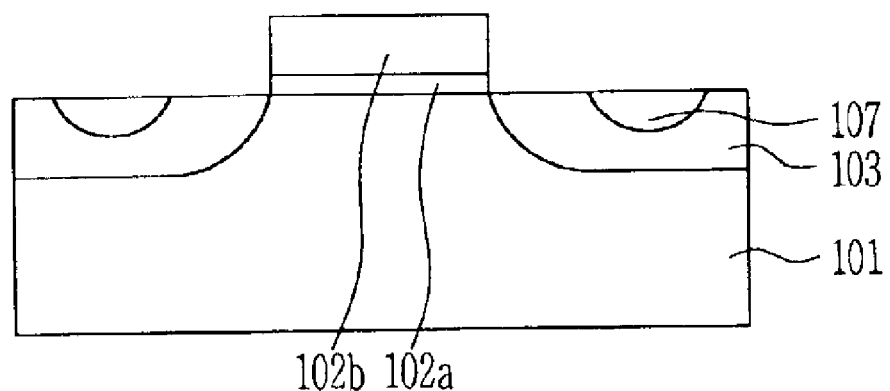

Referring to FIG. 1E, the ion implantation mask layer (104 in FIG. 1D) is removed. The impurities (As and P) implanted into the double diffused drain junction 103 are activated by an annealing process. At this time, the annealing process may be performed in the furnace at a temperature of 800 through 950° C. or at a temperature of 850 through 950° C. as rapid annealing. Thereby, the high voltage junction 107 of the semiconductor device is completed.

At this time, activation can be facilitated and remaining crystal defects generated during the ion implantation process for forming the amorphous layer (105 in FIG. 1D) can be prohibited by maximum, by performing the annealing process at a high temperature. Further, during the annealing process, as diffusion of the impurities of the ion implantation layer 106 is prohibited while being activated, by the amorphous layer 105, the high voltage junction 107 of the shallow depth can be formed even using the high-temperature annealing process. In addition, generation of a channeling phenomenon can be prevented using the shallow junction.

Though not shown in the drawings, an interlayer insulating film is formed on the entire structure and a contact hole is then formed. Next, a conductive material is buried to form a contact plug. At this time, the interlayer insulating film may be formed using BPSG used as an IPO (inter-poly oxide) film.

FIG. 2 is a graph showing a leakage current characteristic depending on the voltage in the high voltage junction of the present invention.

From the drawing, it can be seen that the amount of the leakage current generating when the voltage applied to the high voltage junction is below 20V, is very small, 100 pA through 1 nA, depending on the process condition for forming the high voltage junction. If the voltage applied to the high voltage junction is about over 20 V, it can be seen that the amount of leakage current is abruptly increased while the breakdown is generated. In other words, it can be seen that the breakdown is generated at a high voltage of about 20V. However, the breakdown voltage of over 30 V can be obtained by controlling process conditions such as the depth, area, impurity concentration, annealing condition, etc. of the high voltage junction.

As mentioned above, according to the present invention, the amorphous layer is formed in the double diffused drain junction, the impurity is implanted into the amorphous layer and the impurity is then activated by means of the high-temperature annealing process. Therefore, the following advantageous effect can be obtained.

First, as diffusion of the impurity is prohibited by the amorphous layer, generation of the channeling phenomenon can be prevented since the depth of the high voltage junction is lowered.

Second, as diffusion of the impurity is prohibited, an increase of the sheet resistance in the high voltage junction can be prevented.

Third, as the annealing process for activation is performed at a high temperature, remaining crystal defects can be minimized.

Fourth, generation of the leakage current can be prohibited by maximum by minimizing remaining crystal defects.

Fifth, as diffusion of the impurity is prohibited and an increase of the sheet resistance is prevented, the area and depth of the high voltage junction can be reduced without reducing the breakdown voltage.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a high voltage junction in a semiconductor device, comprising the steps of:

forming a double diffused drain (DDD) junction in a junction region of a semiconductor substrate on which a gate oxide film and a gate electrode are stacked;

exposing the double diffused drain junction at a region where a contact plug will be formed;

implanting an impurity having a higher atomic weight than an impurity implanted into the double diffused drain junction and simultaneously making amorphous the double diffused drain junction up to a first depth to inhibit a diffusion of an impurity which will be implanted by a subsequent second ion implantation process, by means of a first ion implantation process, wherein the first depth is the same as or shallower than the depth of the double diffused drain junction and the amorphous region is formed within said double diffused region;

implanting an impurity having a lower atomic weight than the impurity implanted by means of the first ion implantation process up to a second depth shallower than the first depth by means of a second ion implantation process so that the concentration of the impurity becomes a target value; and activating the impurities implanted into the double diffused drain junction by means of an annealing process.

2. The method as claimed in claim 1, wherein the gate oxide film is formed in thickness of 200 through 400 Å by means of a wet oxidization method.

3. The method as claimed in claim 1, wherein the double diffused drain junction is formed by implanting P of 1E13 through 1E14 atoms/cm$^2$ at the ion implantation energy of 50 KeV through 120 KeV.

4. The method as claimed in claim 3, wherein P is implanted at an angle of 0 through 22.

5. The method as claimed in claim 1, wherein the first ion implantation process includes implanting As of 1E15 through 2E15 atoms/cm$^2$ at the ion implantation energy of 10 KeV through 40 KeV.

6. The method as claimed in claim 1, wherein the second ion implantation process includes implanting P.

7. The method as claimed in claim 1, wherein the second ion implantation process includes implanting P of 1E13 through 1E14 atoms/cm$^2$ at the ion implantation energy of 0.5 KeV through 30 KeV.

8. The method as claimed in claim 7, wherein P is implanted at an angle of 0 through 22.

9. The method as claimed in claim 1, wherein the annealing process is performed in the furnace at a temperature of 800 through 950° C.

10. The method as claimed in claim 1, wherein the annealing process is performed at a temperature of 850 through 950° C. as rapid annealing.

11. The method as claimed in claim 1, wherein the double diffused drain (DDD) junction is formed simultaneously at both sides of the gate electrode.

* * * * *